US010043700B2

(12) United States Patent
Francis

(10) Patent No.: US 10,043,700 B2
(45) Date of Patent: Aug. 7, 2018

(54) METHOD OF FABRICATING DIAMOND-SEMICONDUCTOR COMPOSITE SUBSTRATES

(71) Applicant: RFHIC Corporation, Anyang-si (KR)

(72) Inventor: Daniel Francis, Santa Clara, CA (US)

(73) Assignee: RFHIC CORPORATION, Anyang (KR)

( * ) Notice: Subject to any disclaimer, the term of this patent is extended or adjusted under 35 U.S.C. 154(b) by 0 days.

(21) Appl. No.: 15/570,361

(22) PCT Filed: May 11, 2016

(86) PCT No.: PCT/EP2016/060493
§ 371 (c)(1),
(2) Date: Oct. 30, 2017

(87) PCT Pub. No.: WO2016/180849
PCT Pub. Date: Nov. 17, 2016

(65) Prior Publication Data
US 2018/0151404 A1 May 31, 2018

Related U.S. Application Data

(60) Provisional application No. 62/161,636, filed on May 14, 2015.

(30) Foreign Application Priority Data

Jun. 5, 2015 (GB) .................................. 1509766.0

(51) Int. Cl.
*H01L 21/683* (2006.01)
*H01L 21/762* (2006.01)
(Continued)

(52) U.S. Cl.
CPC ...... *H01L 21/6835* (2013.01); *H01L 21/0262* (2013.01); *H01L 21/02389* (2013.01);
(Continued)

(58) Field of Classification Search
CPC . H01L 2224/83224; H01L 2224/83192; H01L 2224/83052; H01L 2924/10344;
(Continued)

(56) References Cited

U.S. PATENT DOCUMENTS

| 7,595,507 | B2 | 9/2009 | Francis et al. |
| 2006/0266280 | A1 | 11/2006 | Francis |

(Continued)

FOREIGN PATENT DOCUMENTS

| CN | 102664221 A | 9/2012 |
| CN | 102699537 A | 10/2012 |

(Continued)

*Primary Examiner* — Moin Rahman
(74) *Attorney, Agent, or Firm* — Patent Office of Dr. Chung Park

(57) ABSTRACT

A method of fabricating a semiconductor-on-diamond composite substrate, the method comprising: (i) starting with a native semiconductor wafer comprising a native silicon carbide substrate on which a compound semiconductor is disposed; (ii) bonding a silicon carbide carrier substrate to the compound semiconductor; (iii) removing the native silicon carbide substrate; (iv) forming a nucleation layer over the compound semiconductor; (v) growing polycrystalline chemical vapor deposited (CVD) diamond on the nucleation layer to form a composite diamond-compound semiconductor-silicon carbide wafer, and (vi) removing the silicon carbide carrier substrate y laser lift-off to achieve a layered structure comprising the compound semiconductor bonded to the polycrystalline CVD diamond via the nucleation layer, wherein in step (ii) the silicon carbide carrier substrate is bonded to the compound semiconductor via a laser absorption material which absorbs laser light, wherein (Continued)

the laser has a coherence length shorter than a thickness of the silicon carbide carrier substrate.

15 Claims, 1 Drawing Sheet

(51) Int. Cl.
*H01L 21/02* (2006.01)
*H01L 23/00* (2006.01)
*H01L 23/373* (2006.01)
H01L 21/3065 (2006.01)
H01L 21/304 (2006.01)

(52) U.S. Cl.
CPC .. *H01L 21/02527* (2013.01); *H01L 21/02595* (2013.01); *H01L 21/7624* (2013.01); *H01L 23/3732* (2013.01); *H01L 24/29* (2013.01); *H01L 24/83* (2013.01); *H01L 24/98* (2013.01); H01L 21/304 (2013.01); H01L 21/3065 (2013.01); H01L 2221/68345 (2013.01); H01L 2221/68381 (2013.01); H01L 2224/29193 (2013.01); H01L 2224/83052 (2013.01); H01L 2224/83192 (2013.01); H01L 2224/83224 (2013.01); *H01L 2924/01014* (2013.01); *H01L 2924/1033* (2013.01); *H01L 2924/10272* (2013.01); *H01L 2924/10323* (2013.01); *H01L 2924/10344* (2013.01)

(58) Field of Classification Search
CPC ... H01L 2924/10323; H01L 2924/1033; H01L 2924/10272; H01L 2924/01014; H01L 21/3065; H01L 2221/68345
USPC ....... 438/459, 458, 455, 481; 257/27, 77, 11
See application file for complete search history.

(56) References Cited

U.S. PATENT DOCUMENTS

2013/0221377 A1* 8/2013 Ward .................... C30B 25/183
257/77
2014/0141595 A1 5/2014 Babic et al.

FOREIGN PATENT DOCUMENTS

CN 202655797 U 1/2013
EP 2 262 011 A2 12/2010

* cited by examiner

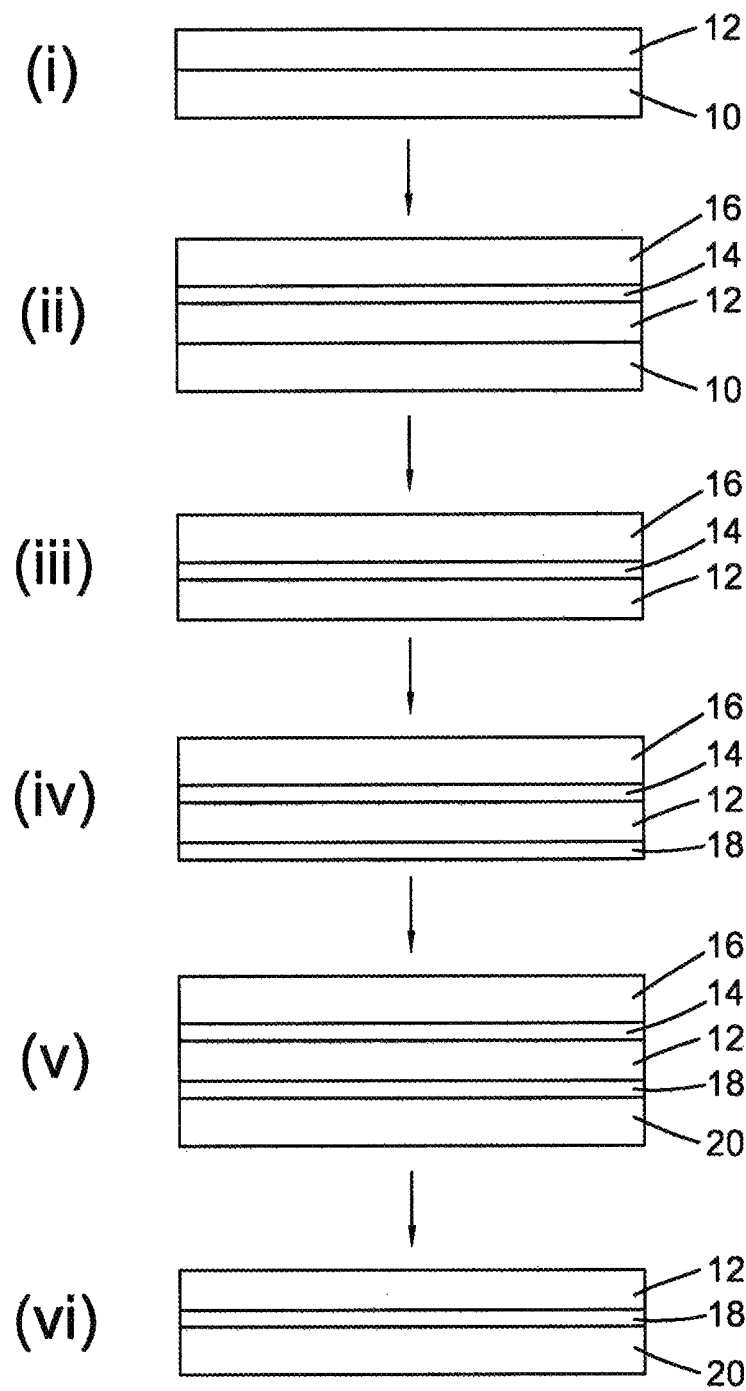

METHOD OF FABRICATING DIAMOND-SEMICONDUCTOR COMPOSITE SUBSTRATES

CROSS-REFERENCE TO PRIOR APPLICATIONS

This application is a national Stage Patent Application of PCT International Patent Application No. PCT/EP2016/060493, filed on May 11, 2016 under 35 U.S.C. § 371, which claims priority of U.S. Patent Application No. 62/161,636, filed on May 14, 2015 and GB Patent Application No. 1509766.0, filed on Jun. 5, 2015, now issued as patent GB 2539780B, which are all hereby incorporated by reference in their entirety.

FIELD OF INVENTION

The present invention relates to methods of fabricating diamond-semiconductor composite substrates. Particular embodiments are directed to a method of fabricating gallium nitride (GaN) on diamond substrates starting from a GaN on silicon carbide (SiC) substrate.

BACKGROUND OF INVENTION

Next generation semiconductor devices and particularly those based on compound semiconductors such as gallium nitride have been proposed for high power and/or high frequency devices such as high electron mobility transistors (HEMTs). One limitation to enabling the full benefits of compound semiconductors such as GaN to be realized is that of thermal management. To this end, it has been proposed to integrate a synthetic diamond heat spreading substrate, which has very high thermal conductivity, in close proximity with a semiconductor device structure, such as a GaN based semiconductor device structure, to enable higher power density usage, higher device packing densities, and/or to increase the lifetime of such devices.

In recent years, methods of fabricating high quality single crystal GaN on single crystal silicon substrates have been developed. These methods typically involve the provision of strain management layers immediately over the silicon substrate on which the single crystal GaN is epitaxially grown to alleviate strain resulting from lattice mismatch between the single crystal silicon substrate and the single crystal GaN material. As such, high quality single crystal GaN on silicon substrates is now commercially available. However, one problem with such substrates is that the thermal conductivity of the silicon material is relatively low and thus the overlying GaN cannot be driven to its full potential without thermal management issues arising.

In addition to the above, methods of fabricating high quality single crystal GaN on single crystal silicon carbide substrates have also been developed. Silicon carbide has a higher thermal conductivity than silicon. Again, the methods typically involve the provision of strain management layers immediately over the silicon carbide substrate on which the single crystal GaN is epitaxially grown to alleviate strain resulting from lattice mismatch between the single crystal silicon carbide substrate and the single crystal GaN material. As such, high quality single crystal GaN on silicon carbide substrates is now commercially available and for certain applications such substrate wafers are preferred due to certain characteristics of the GaN, e.g. low defect density, in addition to the improved thermal performance of the silicon carbide based substrate. One drawback is that these silicon carbide based substrates are more expensive than the silicon based alternative. Furthermore, although the thermal conductivity of the silicon carbide is higher than silicon, the overlying GaN still cannot be driven to its full potential without thermal management issues arising.

One possible alternative to the silicon and silicon carbide solutions which are currently available is to develop a method of fabricating high quality single crystal semiconductor layers such as GaN on a synthetic diamond substrate which has much higher thermal conductivity than other thermal management materials. In this regard, it is possible to grow semiconductors such as GaN on a diamond substrate, usually with a thin single crystal silicon or silicon carbide layer disposed on the diamond substrate with GaN being epitaxially grown on the thin silicon or silicon carbide layer. However, to date it has not been possibly to achieve the same quality of single crystal GaN material on such substrates due to strain management issues when compared with GaN growth on silicon or silicon carbide substrates. Furthermore, it is difficult to provide a high quality, low defect thin layer of single crystal silicon or silicon carbide on a diamond substrate which provides a good epitaxial substrate for semiconductor growth and which is also exceedingly thin (e.g. less than 50 nm thickness) to alleviate thermal barrier resistance problems between the overlying semiconductor and the underlying diamond heat spreading material.

In light of the above, an alternative approach has been proposed in which the GaN is grown on a silicon or silicon carbide substrate and then the GaN is transferred to a synthetic diamond substrate. Since single crystal semiconductors usually have an epitaxial layered structure (a so-called "epilayer" structure) which is optimized for a semiconductor device fabricated on an exposed upper surface, then in most instances it is desirable for the underlying silicon or silicon carbide substrate to be replaced by a synthetic diamond substrate rather than merely providing a diamond layer on the exposed upper surface of the GaN epilayer structure. That is, the transfer process involves the removal of the native growth substrate and the provision of a synthetic diamond substrate in its place. In such a process, two factors are of importance: (i) that the transfer process does not unduly damage the GaN epilayer structure; and (ii) that the synthetic diamond substrate is integrated in close thermal contact with the GaN epilayer structure with a low thermal barrier resistance between the active GaN epilayer structure and the synthetic diamond material.

U.S. Pat. No. 7,595,507 discloses a fabrication route to transfer a GaN epilayer structure from a native silicon substrate to a synthetic diamond based substrate. The methodology comprises: (i) providing a native growth substrate (e.g. silicon) on which a compound semiconductor (e.g. GaN) is disposed; (ii) bonding a carrier substrate to the compound semiconductor layer; (iii) removing the native growth substrate; (iv) forming a nucleation layer over the compound semiconductor layer; (v) growing polycrystalline CVD diamond on the nucleation layer, and then (vi) removing the carrier substrate to achieve a layered structure comprising the compound semiconductor bonded to the polycrystalline CVD diamond via the nucleation layer.

In the above-described fabrication route, usually the material selected for the intermediate carrier substrate will be the same as that of the native growth substrate to avoid introducing different stress management issues. If silicon is used for the native substrate and intermediate carrier substrate then these substrates can in principle be removed by, for example, conventional mechanical grinding techniques and/or a combination of grinding and etching. However, in this regard it has been found that while conventional grinding works for the growth substrate because the wafer is flat at this stage of the process, the removal of the intermediate carrier substrate after diamond growth is more problematic. This is because the intermediate carrier substrate is bowed after diamond growth and cannot easily be removed by conventional grinding.

U.S. Pat. No. 7,595,507 indicates that typical substrates used for growth of wide-gap semiconductors are sapphire, silicon carbide and silicon and that if the substrate is sapphire or silicon carbide whose removal is difficult, the substrate may be removed by chemical lift-off or laser lift-off. However, attempts to remove a silicon carbide intermediate carrier substrate after diamond growth have proved problematic. The silicon carbide cannot be easily etched either by wet or dry chemical processes. Furthermore, it cannot be easily removed by lapping because the bow of the silicon carbide-semiconductor-diamond composite wafer after diamond growth exceeds its thickness. Further still, attempts to remove the silicon carbide carrier substrate using a laser lift off technique have caused the diamond-semiconductor wafer to shatter when such a technique is utilized.

In light of the above, it is an aim of embodiments of the present invention to solve the aforementioned problem and provide a viable fabrication route for manufacturing diamond-semiconductor composite substrates starting with silicon carbide-semiconductor native wafers.

SUMMARY OF INVENTION

The present invention provides a method of fabricating a semiconductor-on-diamond composite substrate, the method comprising:

(i) starting with a native semiconductor wafer comprising a native silicon carbide growth substrate on which a compound semiconductor is disposed;

(ii) bonding a silicon carbide carrier substrate to the compound semiconductor;

(iii) removing the native silicon carbide growth substrate;

(iv) forming a nucleation layer over the compound semiconductor;

(v) growing polycrystalline CVD diamond on the nucleation layer to form a composite diamond-compound semiconductor-silicon carbide wafer, and (vi) removing the silicon carbide carrier substrate to achieve a layered structure comprising the compound semiconductor bonded to the polycrystalline CVD diamond via the nucleation layer, wherein in step (ii) the silicon carbide carrier substrate is bonded to the compound semiconductor via a laser absorption material which absorbs laser light at a coherence length shorter than a thickness of the silicon carbide carrier substrate, wherein in step (vi) the silicon carbide carrier substrate is removed from the compound semiconductor by:

heating the composite diamond-compound semiconductor-silicon carbide wafer to a temperature of at least 100° C.;

directing laser light having a coherence length shorter than the thickness of the silicon carbide carrier substrate through the silicon carbide carrier substrate, the laser light being absorbed by the laser absorption material; and cooling the composite diamond-compound semiconductor-silicon carbide wafer after exposure to the laser light causing separation of the silicon carbide carrier substrate from the compound semiconductor.

BRIEF DESCRIPTION OF THE DRAWINGS

For a better understanding of the present invention and to show how the same may be carried into effect, embodiments of the present invention will now be described by way of example only with reference to the accompanying drawings, in which:

FIGS. 1(i) to 1(vi) illustrate a fabrication route for manufacturing semiconductor-on-diamond wafers starting with semiconductor-on-silicon carbide wafers.

DETAILED DESCRIPTION

Embodiments of the present invention provide a viable means of fabricating diamond-semiconductor composite substrates starting with silicon carbide-semiconductor native wafers. The starting point for the fabrication method as illustrated in FIG. 1(i) is a native semiconductor wafer comprising a native silicon carbide growth substrate 10 on which a compound semiconductor 12 (e.g. GaN) is disposed. As described in the background section, such wafers are commercially available and have been developed such that the single crystal compound semiconductor is very high quality with a low defect density.

In step (ii) illustrated in FIG. 1, a silicon carbide carrier substrate 16 is bonded to the compound semiconductor 12 via a laser absorption material 14 which absorbs laser light at a longer wavelength than the silicon carbide carrier substrate 16. The laser absorption material 14 is utilized later in the fabrication process in a laser lift-off step to release the silicon carbide carrier substrate 16. The material is selected to absorb laser light which is passed through the silicon carbide carrier substrate and may be a ceramic material (e.g. poly silicon or amorphous silicon) or another material that can survive the bonding process and strongly absorbs light which the silicon carbide carrier substrate transmits. The laser absorption material can be coated on the silicon carbide carrier substrate prior to bonding the silicon carbide carrier substrate to the compound semiconductor. For example, silicon carbide does not absorb 1 micrometer wavelength light while poly silicon does. As such, it is possible to direct 1 micrometer wavelength light through a silicon carbide carrier substrate and have the light absorbed by a poly silicon layer creating a separation of the silicon carbide carrier substrate as described later.

The silicon carbide carrier substrate may have a thickness in a range 100 to 2000 micrometers. The thickness of the silicon carbide carrier substrate must be larger than coherence length of the laser light used in the lift-off procedure later in the fabrication method. It has been found that if the coherence length of the laser light is longer than the thickness of the silicon carbide carrier substrate then smooth and complete lift-off of the silicon carbide carrier substrate is not achieved. It may also be noted that the fabrication method as described herein is capable of smooth and complete lift off of large diameter silicon carbide carrier substrates. For example, the silicon carbide carrier substrate may have a diameter of at least 50 mm, 80 mm, 100 mm, 120 mm, 140 mm, or 150 mm.

In step (iii) illustrated in FIG. 1, the native silicon carbide growth substrate 10 is removed. According to one possibility, the native silicon carbide growth substrate 10 is removed using a two-step process comprising: mechanical lapping or polishing off a majority of the native silicon carbide growth substrate 10; and dry etching a remainder of the native silicon carbide growth substrate. Since the composite wafer is still in a flat configuration at this stage of the process, bowing is not a significant problem and thus the native silicon carbide substrate can be removed in this manner using conventional processing steps. It is only later after CVD diamond growth that significant bowing of the composite substrate makes removal of the silicon carbide carrier substrate particularly problematic.

After removal of the native silicon carbide growth substrate 10 the lower surface of the compound semiconductive epilayer structure is exposed. However, thin native strain matching layers remain at the exposed surface and these are advantageously also removed. As these layers are exceedingly thin, careful processing is required at this stage to remove the native strain matching layers, and optionally a portion of a native buffer layer in the epilayer structure, without damaging the active region of the compound semiconductor epilayer structure.

Once a clean, flat, low roughness exposed lower surface of the compound semiconductor epilayer structure 12 is achieved, a nucleation layer 18 is provided thereon which is suitable for diamond growth as illustrated in FIG. 1(*iv*). The nucleation layer 18 may comprise one or more of: nanocrystalline diamond; silicon carbide, silicon, silicon nitride, silicon dioxide, aluminium nitride, magnesium oxide, boron nitride, or beryllium oxide. The nucleation layer 18 may also be seeded with diamond powder prior to diamond growth. The nucleation layer serves to protect the compound semiconductor during diamond growth and also provides a suitable surface for diamond growth. However, it should be made very thin (e.g. less than 50 nm thickness) as otherwise the layer provides a thermal barrier which reduces the benefits of integrating a diamond heat spreading layer into the structure in the subsequent fabrication step.

In step (v) illustrated in FIG. 1, polycrystalline chemical vapour deposited (CVD) diamond 20 is grown on the nucleation layer 18 to form a composite diamond-compound semiconductor-silicon carbide wafer. A relatively thick, high thermal conductance layer of polycrystalline CVD diamond may be provided for efficient heat spreading. For example, the polycrystalline CVD diamond may be grown to a thickness of at least 50 micrometers, 100 micrometers, 150 micrometers, 200 micrometers, or 300 micrometers. However, due to a difference in thermal expansion coefficient between the silicon carbide and the diamond material, the resultant diamond-compound semiconductor-silicon carbide wafer is significantly bowed. This is problematic when it comes to removing the silicon carbide carrier substrate which is required to achieve the final semiconductor-on-diamond wafer as discussed below.

Post diamond growth, the silicon carbide substrate needs to be removed to leave the compound semiconductor-on-diamond as a free standing wafer. However, the silicon carbide is difficult to remove because it cannot be easily etched either by wet or dry chemical processes. Furthermore, it also cannot be easily removed by lapping or polishing because the bow of the SiC wafer exceeds its thickness. It has been proposed to use a laser lift-off technique for the silicon carbide carrier substrate by firing a laser through the silicon carbide substrate to be absorbed at an intermediate layer between the silicon carbide and the compound semiconductor. However, this has been found to be problematic because the built in stress in the diamond-silicon carbide system (caused by differences in CTE over temperature) causes the wafer to explode during the laser lift off-process.

The present inventors have now found a specific implementation of the laser lift-off process that avoids cracking and breaking of the wafer during the laser lift-off process. In the method, as illustrated in FIG. 1(*vi*), the silicon carbide carrier substrate 16 is removed to achieve a layered structure comprising the compound semiconductor 12 bonded to the polycrystalline CVD diamond 20 via the nucleation layer 18. The removal step comprises:

heating the composite diamond-compound semiconductor-silicon carbide wafer to a temperature of at least 100° C. (e.g. at least 150° C., 200° C., 300° C., 400° C., or 450° C.);

directing laser light having a coherence length shorter than the thickness of the silicon carbide carrier substrate through the silicon carbide carrier substrate 16, the laser light being absorbed by the laser absorption material 14; and cooling the composite diamond-compound semiconductor-silicon carbide wafer after exposure to the laser light causing separation of the silicon carbide carrier substrate 16 from the compound semiconductor 12.

It has been found that by heating the wafer to a modest level and using a short coherence length laser it is possible to achieve clean and complete separation of large area silicon carbide carrier wafers without fracturing the diamond-semiconductor wafer. It is thus required to select a laser with a coherence length shorter than the thickness of the silicon carbide carrier substrate and then heat the substrate to a temperature of greater than 150° C., 200° C., 300° C., 400° C., or 450° C.

If a longer coherence length laser is utilized then the wafer develops a pattern of separated and unseparated regions. The result of such a process is that the composite wafer cracks during the separation process. Furthermore, it has also been found that if the separation process is performed at room temperature, the separation involves the release of a significant amount of built in energy. This energy release fractures the wafer and causes regions of semiconductor material to remain attached to the silicon carbide carrier rather than the diamond substrate. To allow for a slow release of the diamond/semiconductor from the silicon carbide, both the diamond and silicon carbide are heated to a temperature above e.g. 200° C. during the laser lift-off process and then after the entire wafer has been exposed to the laser the entire wafer is cooled down creating a smooth and uniform separation.

During the laser-lift off step, the composite diamond-compound semiconductor-silicon carbide wafer may be heated to a temperature of at least 100° C., 150° C., 200° C., 300° C., 400° C., or 450° C. and/or no more than 650° C., 600° C., or 550° C. and/or in a range defined by any combination of these upper and lower values. The fact that this can be done at such a low temperature is surprising because a measurement of the bow of a silicon carbide on diamond wafer indicates that to get the diamond on silicon carbide bow to reduce below 200 micrometers via heating would require heating the wafer to over 650° C. In this regard, 200 micrometers of bow is a relevant number because that is the bow required to get to the same stress level as a standard diamond on silicon wafer. As such, it is surprising that the removal step can be performed using only moderate heating between 100° C. and 650° C.

The coherence length of the laser light may be in a range 10 micrometers to 400 micrometers. Furthermore, the laser light may have a wavelength in a range 400 nm to 1200 nm and/or a pulse width in a range 1 nanosecond to 1000 nanoseconds. In this regard, it may be noted that the coher ence length, $L_c$, of a light source is given approximately by the relationship:

$$L_c = \lambda^2/\Delta\lambda$$

where $\lambda$ is the wavelength of the light and $\Delta\lambda$ is the spectral bandwidth. For nearly transform limited pulses, the coherence length and the pulse width are directly related by $L_c \approx c\tau$. For example, a 100 fs laser pulse has a coherence length of approximately 30 µm.

It is surprising that that a short coherence length laser is required for this application as longer coherence length lasers are usually thought to be a better laser for most applications. In this respect, a lower quality laser is better for this application. Such a laser can be scanned over the silicon carbide carrier substrate until the entire layer of laser absorption material is exposed to laser light prior to cooling to effect separation.

The present methodology may be applied to a number of different types of semiconductor-on-silicon carbide wafers to substitute the silicon carbide substrate for a diamond substrate. For example, the compound semiconductor may comprise one or more of gallium nitride, aluminium nitride, aluminium gallium nitride, and indium aluminium gallium nitride.

While this invention has been particularly shown and described with reference to embodiments, it will be understood to those skilled in the art that various changes in form and detail may be made without departing from the scope of the invention as defined by the appending claims.

What is claimed is:

1. A method of fabricating a semiconductor-on-diamond composite substrate, the method comprising:
   (i) starting with a native semiconductor wafer comprising a native silicon carbide growth substrate on which a compound semiconductor is disposed;
   (ii) bonding a silicon carbide carrier substrate to the compound semiconductor;
   (iii) removing the native silicon carbide growth substrate;
   (iv) forming a nucleation layer over the compound semiconductor;
   (v) growing polycrystalline CVD diamond on the nucleation layer to form a composite diamond-compound semiconductor-silicon carbide wafer, and
   (vi) removing the silicon carbide carrier substrate to achieve a layered structure comprising the compound semiconductor bonded to the polycrystalline CVD diamond via the nucleation layer,
   wherein in step (ii) the silicon carbide carrier substrate is bonded to the compound semiconductor via a laser absorption material which absorbs laser light at a coherence length shorter than a thickness of the silicon carbide carrier substrate,
   wherein in step (vi) the silicon carbide carrier substrate is removed from the compound semiconductor by:
   heating the composite diamond-compound semiconductor-silicon carbide wafer to a temperature of at least 100° C.;
   directing laser light having a coherence length shorter than the thickness of the silicon carbide carrier substrate through the silicon carbide carrier substrate, the laser light being absorbed by the laser absorption material; and
   cooling the composite diamond-compound semiconductor-silicon carbide wafer after exposure to the laser light causing separation of the silicon carbide carrier substrate from the compound semiconductor.

2. A method according to claim 1, wherein the laser absorption material provided between the silicon carbide carrier substrate and the compound semiconductor is a ceramic material.

3. A method according to claim 2, wherein the laser absorption material provided between the silicon carbide carrier substrate and the compound semiconductor is polycrystalline or amorphous silicon.

4. A method according to claim 1, wherein the laser absorption material is coated on the silicon carbide carrier substrate prior to bonding the silicon carbide carrier substrate to the compound semiconductor.

5. A method according to claim 1, wherein the silicon carbide carrier substrate has a thickness in a range 100 micrometers to 2000 micrometers.

6. A method according to claim 1, wherein in the silicon carbide carrier substrate has a diameter of at least 50 mm, 80 mm, 100 mm, 120 mm, 140 mm, or 150 mm.

7. A method according to claim 1, wherein the native silicon carbide growth substrate is removed using a two-step process comprising:
   mechanical lapping or polishing off a majority of the native silicon carbide growth substrate;
   dry etching a remainder of the native silicon carbide growth substrate.

8. A method according to claim 1, wherein the nucleation layer comprises one or more of: nanocrystalline diamond; silicon carbide, silicon, silicon nitride, silicon dioxide, aluminium nitride, magnesium oxide, boron nitride, and beryllium oxide.

9. A method according to claim 1, wherein polycrystalline CVD diamond is grown to a thickness of at least 50 micrometers, 100 micrometers, 150 micrometers, 200 micrometers, or 300 micrometers.

10. A method according to claim 1, wherein in step (vi) the composite diamond-compound semiconductor-silicon carbide wafer is heated to a temperature in a range 100 to 550° C.

11. A method according to claim 1, wherein the coherence length of the laser light is in a range 10 micrometers to 400 micrometers.

12. A method according to claim 1, wherein the laser light has a wavelength in a range 400 nm to 1200 nm.

13. A method according to claim 1, wherein the laser light has a pulse width in a range 1 to 1000 nanoseconds.

14. A method according to claim 1, wherein the step of directing laser light through the silicon carbide carrier substrate to be absorbed by the laser absorption material comprises moving the laser beam over the silicon carbide carrier substrate until the entire layer of laser absorption material is exposed to laser light prior to cooling.

15. A method according to claim 1, wherein the compound semiconductor comprises one or more of gallium nitride, aluminium nitride, aluminium gallium nitride, and indium aluminium gallium nitride.

* * * * *